United States Patent [19]
Brune et al.

[11] Patent Number: 5,406,088
[45] Date of Patent: Apr. 11, 1995

[54] SCAN AND TILT APPARATUS FOR AN ION IMPLANTER

[75] Inventors: Robert A. Brune; Andrew M. Ray, both of Austin, Tex.

[73] Assignee: Eaton Corporation, Cleveland, Ohio

[21] Appl. No.: 172,441

[22] Filed: Dec. 22, 1993

[51] Int. Cl.[6] .............................................. H01J 37/20
[52] U.S. Cl. .......................... 250/442.11; 250/492.21
[58] Field of Search ................. 250/442.11.492.21, 398

[56] References Cited

U.S. PATENT DOCUMENTS

| | | | |
|---|---|---|---|
| 3,778,626 | 12/1973 | Robertson | 250/492.21 |
| 4,745,287 | 5/1988 | Turner | 250/492.21 |
| 4,975,586 | 12/1990 | Ray | 250/492.2 |
| 5,003,183 | 3/1991 | Nogami et al. | 250/492.2 |
| 5,046,992 | 9/1991 | Tamai et al. | 474/84 |
| 5,052,884 | 10/1991 | Igari | 414/744.2 |
| 5,077,511 | 12/1991 | George | 250/442.11 |
| 5,229,615 | 7/1993 | Brune et al. | 250/492.2 |

Primary Examiner—Bruce C. Anderson
Attorney, Agent, or Firm—Frank M. Sajovec

[57] ABSTRACT

An improved scan and tilt apparatus for an ion implanter wherein a wafer-receiving platen assembly is received on the end member of a multiple axis arm system which is operable to effect scanning motion of the wafer along a straight line which intercepts the wafer tilt axis in any tilt position of the platen assembly. The arm system includes a rail and linear bearing system which interconnects an input member with the end member of the arm system to restrict the scanning motion to a straight line.

4 Claims, 4 Drawing Sheets

SCAN AND TILT APPARATUS FOR AN ION IMPLANTER

The present invention relates generally to ion implantation equipment and more particularly to an improved scan and tilt apparatus for an ion implanter.

As the size of semiconductor wafers has increased, the need has developed to provide scanning systems which are capable of producing an ion beam which strikes the wafer perpendicular to the wafer surface at all points across the width of the beam and wherein the beam extends across the full diameter of the wafer.

At the same time, there is a need to implant wafers at widely variable implant angles, and to rotate the wafers during implantation, all while continuing to increase throughput and minimize particulate contamination.

U.S. Pat. No. 5,229,615 to Brune, et al., which is incorporated herein by reference, discloses an end station for an ion implanter including a wafer scan and tilt mechanism which meets the above requirements. It has been found, however, that under certain scan and tilt conditions there is a need for additional rigidity in the system, which is not readily obtainable by merely enlarging certain components of the prior art system.

In the prior art system referred to above, the tilt and scan mechanism is in the form of a multiple axis arm system which is capable of positioning a wafer for a continuously variable range of low to high angle of incidence implantation, rotating the wafer about an axis perpendicular to the wafer surface and effecting scanning of the wafer along a straight line which intercepts the wafer tilt axis in any tilt position of the wafer. In this system, the scanning motion is obtained by rotating a first arm element which is connected to a second arm element through a 2:1 belt drive system, the second arm being connected to a third arm through a 1:2 belt drive system. (This arrangement defines a multiple axis robot arm of the general type described in U.S. Pat. No. 5,046,992.) By arranging the wafer chuck on the third arm such that the wafer surface defines a plane which includes the axis of rotation of the first arm, rotation of the first arm produces linear movement of the third arm along a line which always intercepts the wafer tilt axis.

The present invention connects the outer shaft used for tilting the assembly to the third arm by means of a robust linear bearing assembly which rigidly opposes rotation of the third arm in relation to its tilt axis and which effectively eliminates the need for the 1:2 belt drive between the third and fourth pulleys.

In accordance with another aspect of the invention, a linear encoder which is used to provide a signal indicative of the wafer position to a dose control system, is incorporated in the structure of the linear bearing assembly.

Other objects and advantages of the invention will be apparent from the following description when considered in connection with the accompanying drawings, wherein.

Figure 1:
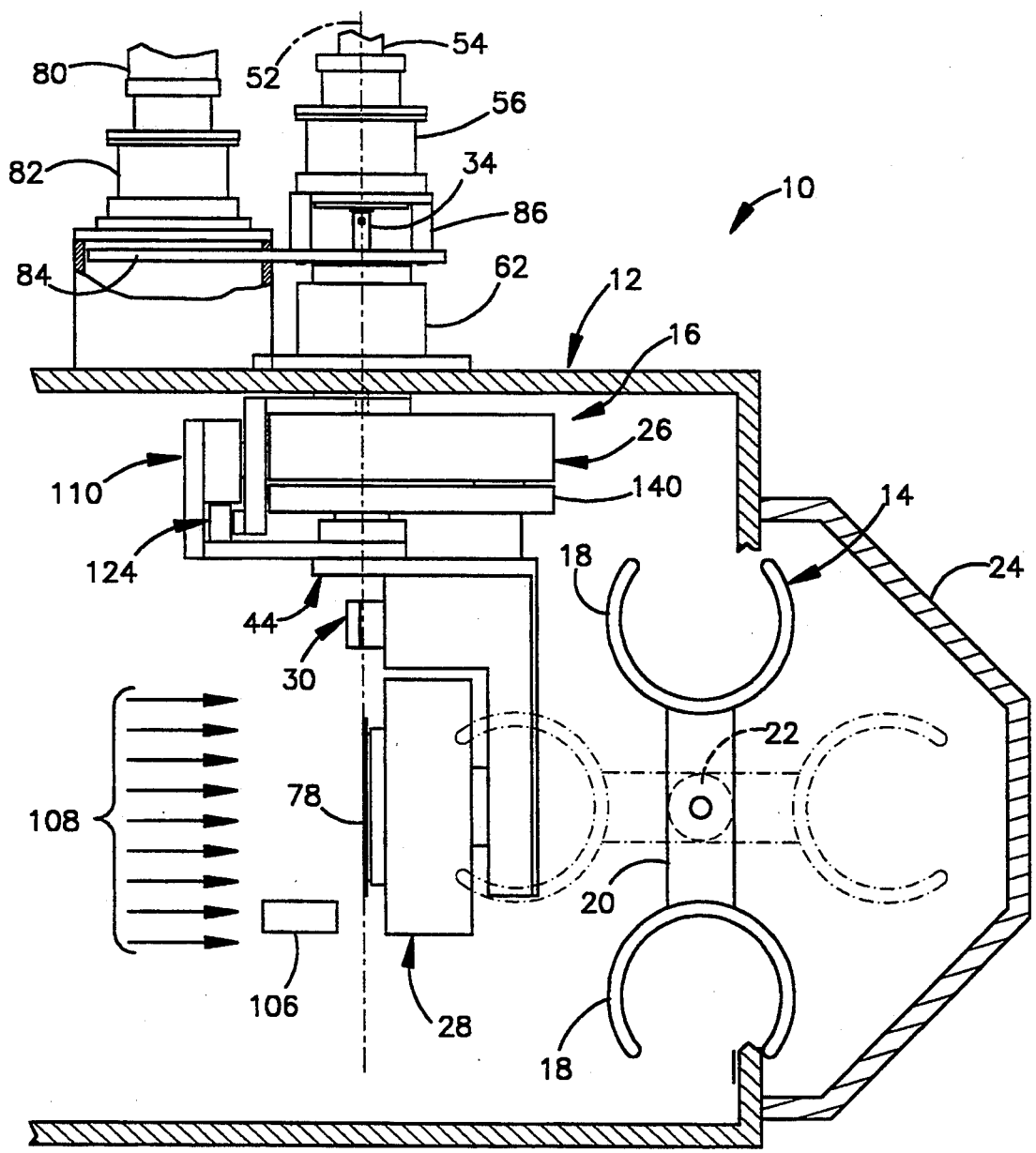
FIG. 1 is a plan view, with parts shown in section and others removed for clarity, of an ion implanter end station incorporating the invention.

Referring to FIG. 1, there is illustrated an end station 10 of an ion implanter which includes a vacuum chamber 12, a transfer arm assembly 14, and a wafer handler 16 incorporating the scan and tilt apparatus of the invention.

The transfer arm assembly 14 does not form part of the present invention and will not be described herein in detail, but can be of the type described in U.S. Pat. No. 5,229,615 referred to above. The assembly consists of a pair of ring-like wafer receiving members 18 received on an arm 20 mounted for movement in O and Z directions on a pedestal assembly 22 which protrudes into the vacuum chamber. In the solid line position of FIG. 1, the arm 20 is in an inactive position, such as it would be during implantation of a wafer. When a wafer is to be transferred from a loading station or the like into an extended portion of the vacuum chamber 12, the arm is rotated to the broken line position and moved in the Z axis as required to deposit the wafer onto the wafer handler 16 for implantation.

The wafer handler 16 comprises a scan and tilt assembly 26, a wafer receiving platen assembly 28 mounted on the scan and tilt assembly, and a rotary drive system 30 mounted on the scan and tilt assembly and operable to rotate the platen about its axis.

Figure 2:
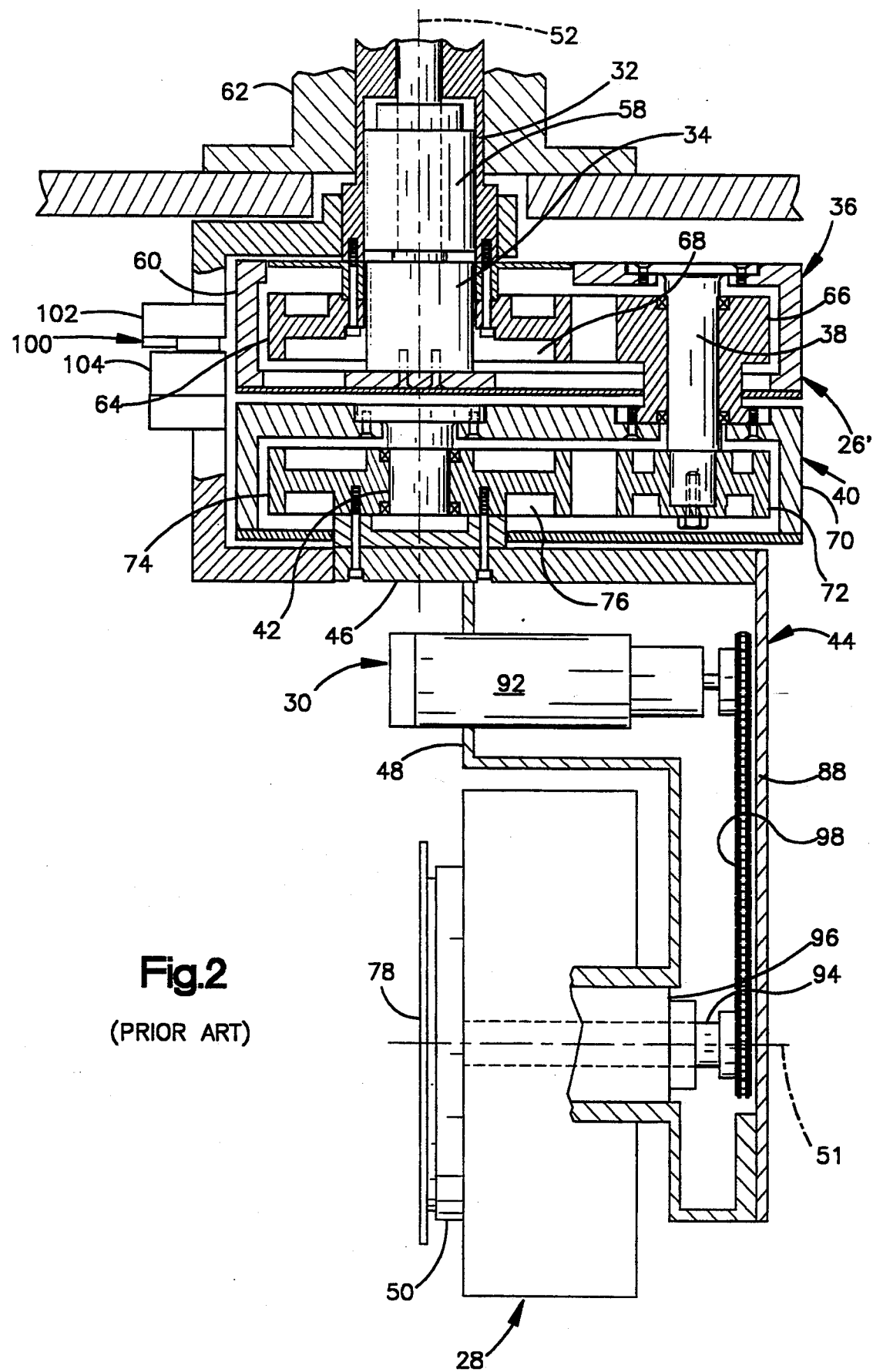
FIG. 2 is a sectional view of a prior art scan and tilt apparatus.

To provide a complete understanding of the present invention, the prior art scan and tilt assembly designated 26' is shown in detail in FIG. 2. The assembly 26' comprises a hollow outer shaft 32, an inner shaft 34 supported for rotation within the outer shaft, a first arm assembly 36 fixed to the inner shaft, a first axle 38 fixed to the outer end of the first arm, a second arm assembly 40 mounted for rotation about the axle 38, a second axle 42 fixed to the outer end of the second arm assembly 40, and a third arm assembly 44 mounted for rotation about the second axle.

The third arm assembly 44 comprises a plate 46, a housing 48 fixed to the plate 46, the platen assembly 28 mounted for rotation on the housing 48, a platen 50 mounted on the platen assembly, and the drive system 30 mounted on the housing and operable to rotate the platen assembly 28 about an axis 51 perpendicular to the axis 52 of the inner and outer shafts 32 and 34. Axis 52 is also perpendicular to the centerline of the ion beam and lies in the extended plane of the face of the wafer. Thus the face plane of the wafer always intersects the same point on the centerline of the ion beam for all combinations of scan, tilt and rotation of the wafer.

Referring to FIG. 1, the drive system of the wafer handler is capable of rotating the entire scan and tilt assembly 26 about axis 52 and of moving the platen assembly 28 linearly in any angular position of the scan and tilt assembly. Referring also to FIG. 2, the inner shaft 34 is driven by a first servo motor 54 through a harmonic reduction system 56. The shaft 34 extends through a Ferrofluidic seal assembly 58, and is fixed to a housing 60 which encloses the first arm assembly 36. The outer shaft 32 extends through a Ferrofluidic seal 62 and is fixed to a first pulley 64. A second pulley 66 is mounted for rotation on the first axle 38, which is fixed to the housing 60. The first and second pulleys are linked by a stainless steel belt 68 which is fixed to both pulleys.

The second pulley 66 is fixed to a housing 70 which encloses the second arm assembly 40, while the first axle 38 is fixed to a third pulley 72 within the second arm. A fourth pulley 74 is fixed to the third arm 44 of the wafer handler and is mounted for rotation on the second axle 42 which is fixed to the housing 70. The third and fourth pulleys are linked by a stainless steel belt 76 fixed to both pulleys. Rotation of the inner shaft 34 by the servo motor 54 causes linear motion of the third arm assembly 44 and thus linear scanning motion of a wafer 78 received on the platen 50 along a line perpendicular to the axis 52. The belt 76 drives the third arm assembly in the exact opposite rotation to arm 40 resulting in no tilt angle change with scan position.

The outer shaft 32 is driven by a second servo motor 80 through a harmonic reduction system 82 and a chain drive system 84 which drives a sprocket fixed to a housing 86 which supports the first servo motor 54 and reduction unit 56. When the outer shaft 32 is driven by the second motor, the inner shaft also rotates; therefore, the entire scan and tilt assembly 26 rotates about axis 52 with no change in the relative positions among the first, second and third arms.

The third arm assembly comprises the plate 46, housing 48 and a cover plate 88 both fastened to the housing, and platen assembly 28 also mounted on the housing. The rotary drive 30 comprises a motor 92 mounted on the housing 48, a platen drive shaft 94 fixed to the platen 50 and mounted for rotation within a Ferrofluidic seal assembly 96 received between the shaft and the housing, and a chain drive system 98 linking the drive shaft 94 and the output shaft of the motor 92.

In accordance with another aspect of the prior art structure, a linear encoder 100 is mounted on the wafer handler to provide a signal proportional to the position of the wafer relative to a baseline in the mechanical scanning direction. This system includes a scale element 102 fixed to the outer shaft 32 of the wafer handler; and a sensor 104 fixed to the third arm assembly 44 and movable along the scale. The linear encoder 100 is used in a dose control system wherein the scan motor is controlled by a dose controller (not shown) which receives inputs from the linear encoder 100, from a dose meter 106 (FIG. 1) which is located in front of the wafer and adjacent the edge thereof, and from a rotary encoder (not shown) attached to servo motor 80.

During implantation, a parallel ribbon beam 108 is generated in one axis (by means not shown) and the scan motor 54 is energized to provide scanning of the wafer in an orthogonal axis. If the implantation process being performed requires it, the wafer 78 can be rotated about an axis perpendicular to its surface by the rotary drive system 30.

Figure 3:
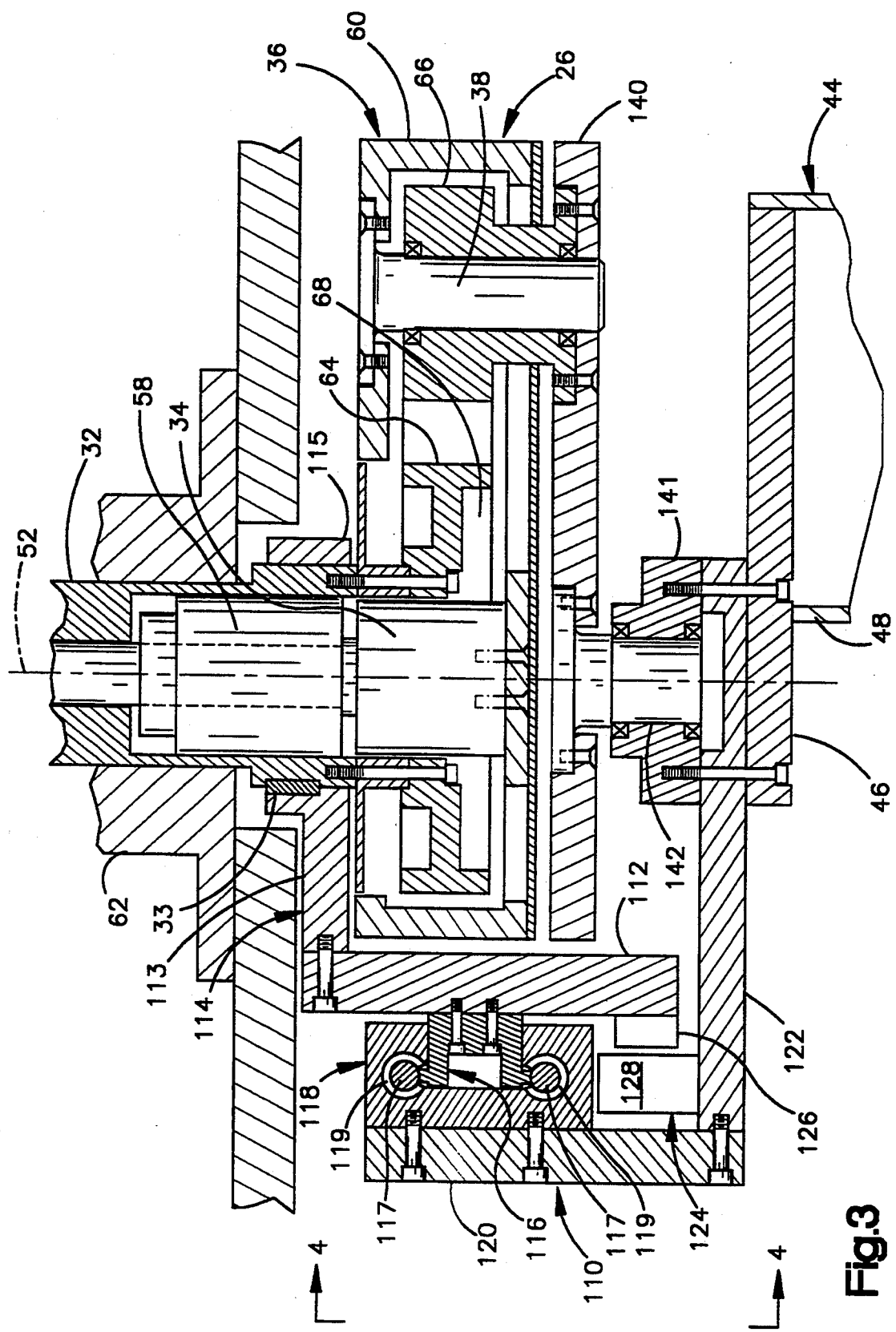
FIG. 3 is a sectional view of the present invention.
Figure 4:
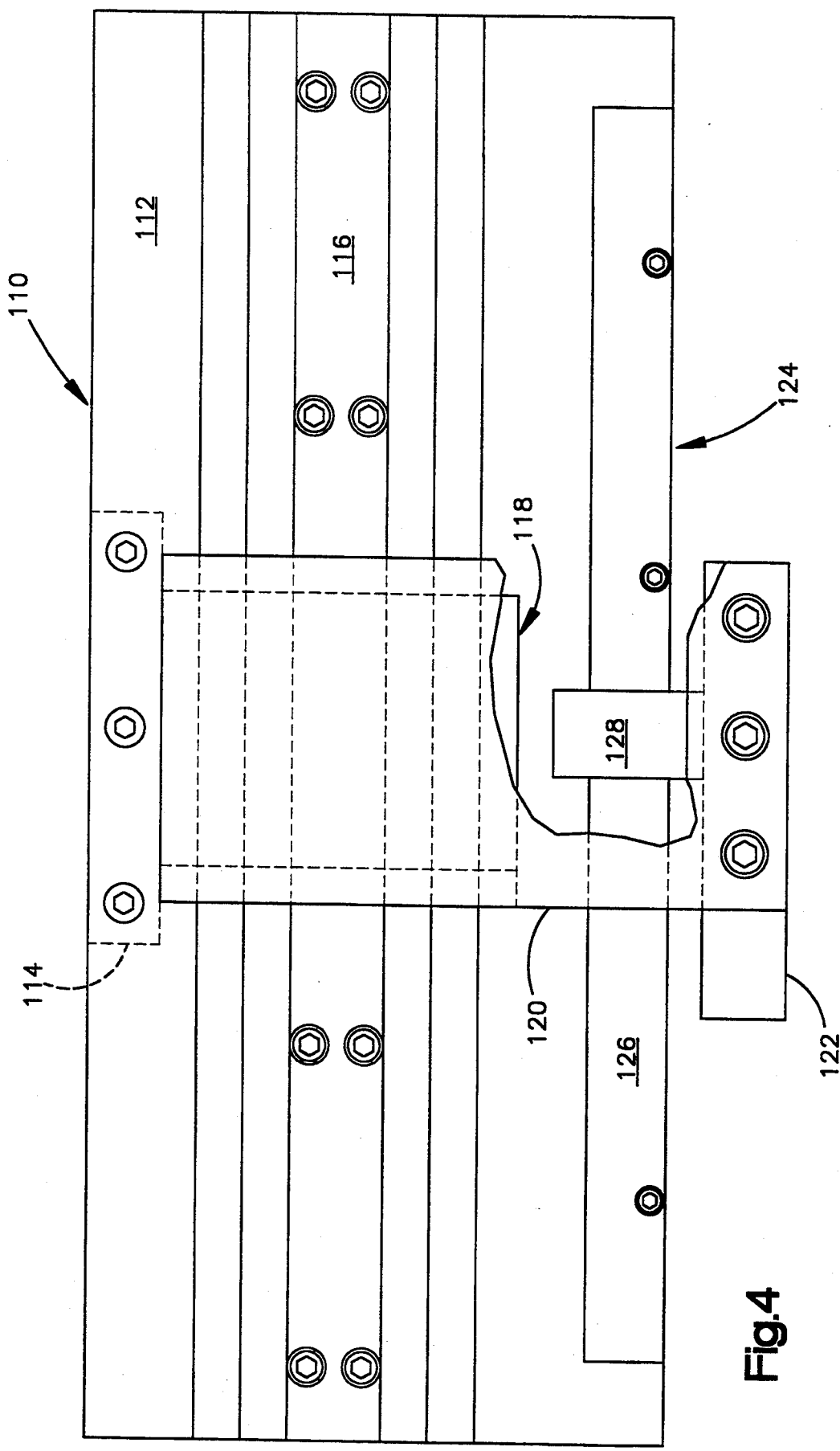
FIG. 4 is an elevation view taken at line 4—4 of FIG. 3.

The present invention is shown in detail in FIGS. 3 and 4, wherein it can be seen that many of the components of the prior art structure are retained. The scan and tilt assembly, designated by the numeral 26, comprises hollow outer shaft 32, inner shaft 34 supported for rotation within the outer shaft, first arm assembly 36 fixed to the inner shaft, first axle 38 fixed to the outer end of the first arm, a second arm assembly 140 mounted for rotation about the axle 38, a second axle 142 fixed to the outer end of the second arm 140, and a third arm assembly 44 mounted for rotation about the second axle.

The third arm assembly 44 is essentially unchanged from the FIG. 2 construction, comprising plate 46, housing 48, platen assembly 28 and platen drive system 30.

Referring to FIGS. 3 and 4, the shaft 34 extends through Ferrofluidic seal assembly 58, and is fixed to housing 60 which encloses the first arm assembly 36. The outer shaft 32 extends through Ferrofluidic seal 62 and is fixed to first pulley 64. Second pulley 66 is mounted for rotation on the first axle 38, which is fixed to the housing 60, and the first and second pulleys are linked by stainless steel belt 68, all of the above construction remaining unchanged from the FIG. 2 construction. In the present structure, the second pulley 66 is fixed to the second arm 140, and a hub 141 to which the third arm 44 is attached is mounted for rotation on the second axle 142.

In accordance with the invention, linear movement of the third arm assembly 44 to effect mechanical scanning upon operation of the scan motor 54, is accomplished by rigidly opposing rotation of third arm assembly in relation to the shaft 32 by means of a linear rail system 110. The rail system 110 comprises a base plate 112, a clamp assembly 114 bolted to the base plate and fixed to the outer shaft 32, a rail assembly 116 bolted to the base plate, a slide carriage assembly 118 movable along the rail, a mounting plate 120 bolted to the slide carriage, and a mounting arm 122 bolted to the plate 120 and to the hub 141. The clamp assembly comprises a clamp member 113 which is maintained in a fixed angular relationship to the shaft 32 by means of a key 33, and clamped to the shaft by a cap member 115 bolted (not shown) thereto.

The rail 116 and slide carriage 118 can be a Thomson model DSR Dual Shaft Rail System wherein the rail assembly comprises a pair of parallel shafts 117 and the slide carriage assembly includes pillow blocks 119 incorporating ball bushings. Such units are commercially available from THOMSON INDUSTRIES INC. and will not be described in detail herein.

Operation of the scan motor 54 results in rotation of the first arm 36 and, through the pulleys 64, 66 and belt 68, rotation of the second arm 140 relative thereto; however, the belt and pulleys in combination with the rail system 110 operate to constrain the motion of the third arm 44 and attached platen assembly 28 to a straight line perpendicular to the axis 52 and into and out of the paper as viewed in FIGS. I and 3.

As described above, when the tilt motor 80 is operated, the inner and outer shafts 32 and 34 are rotated in unison to cause the entire scan and tilt apparatus 26 to rotate about axis 52 to tilt the wafer 78 relative to the ion beam 108, as described in detail in U.S. Pat. No. 5,229,615; however, as also described in the patent, the scanning movement undergone by the wafer 78 is always along a straight line intercepting the axis 52 in any tilt position.

In accordance with the invention, the linear encoder 124 used in the dose control system as described in the above patent is also mounted on the rail system 110. Referring to FIGS. 3 and 4, the encoder comprises an elongated scale element 126 fixed to the base plate 112, and a sensor 128 fixed to the mounting arm 122. As in the prior art structure of FIG. 2, the encoder provides a direct reading of the wafer position in the mechanical scanning direction.

We claim:

1. A wafer handler for an ion implanter comprising a platen having a wafer receiving surface formed thereon, and a scan and tilt assembly operable to rotate said platen about an axis parallel to a plane defined by the surface of a wafer received on said platen and operable to move said platen in a scanning direction along a straight line perpendicular to said axis; said scan and tilt assembly comprising a first arm rotatable about said axis; a second arm mounted on said first arm for relative rotation therewith; a third arm mounted on said second arm for relative rotation therewith, said platen being mounted on said third arm; first drive means operable to rotate said first arm about said axis; means interconnecting said first, second and third arms operable to move said platen in said scanning direction; second drive means operable to rotate said first, second and third arms as a unit about said axis; and means interconnecting said second drive means and said third arm to maintain the rotational position of said third arm; characterized in that said means interconnecting said second drive means and said third arm includes linear bearing means having a first element fixed to said second drive means and a second element fixed to said third arm and mounted for linear movement relative to the first element.

2. Apparatus as claimed in claim 1 in which said first element comprises an elongated rail mounted in fixed position in relation to said second drive means, and said second element comprises a bearing block including bearing means engageable with said rail mounted in fixed position in relation to said third arm.

3. Apparatus as claimed in claims 1 or 2 in which said means interconnecting said first, second and third arms comprises means fixing said first arm to said first drive means; a first shaft fixed to said first arm, a first rotary drive element fixed to said second drive means; a second rotary drive element mounted for rotation on said first shaft and fixed to said second arm; means interconnecting said first and second rotary drive elements defining a speed increase from said first rotary drive element to said second rotary drive element; a second shaft fixed to said second arm; and means mounting said third arm for rotation on said second shaft.

4. Apparatus as claimed in claim 2, including linear encoder means mounted on said means interconnecting said second drive means and said third arm, said linear encoder means comprising an elongated scale element fixed to said elongated rail, and a sensing element mounted in fixed position in relation to said bearing block and in close proximity to said scale.

* * * * *